United States Patent [19]
McGroddy et al.

[11] 4,069,463
[45] Jan. 17, 1978

[54] INJECTION LASER ARRAY

[75] Inventors: James Cleary McGroddy, Putnam Valley; Peter Stephen Zory, Jr., Ossining, both of N.Y.

[73] Assignee: International Business Machines Corporation, Armonk, N.Y.

[21] Appl. No.: 719,793

[22] Filed: Sept. 2, 1976

[51] Int. Cl.$^2$ .............................. H01S 3/19
[52] U.S. Cl. .................. 331/94.5 P; 29/589; 331/94.5 H; 357/55; 357/60; 357/81
[58] Field of Search ............ 331/94.5 H, 94.5 P; 357/18, 81, 55, 60, 80; 29/625, 577, 580, 589

[56] References Cited
U.S. PATENT DOCUMENTS

| | | | |
|---|---|---|---|
| 3,347,703 | 10/1967 | Engelman et al. | 29/625 X |
| 3,936,322 | 2/1976 | Blum et al. | 357/18 X |

OTHER PUBLICATIONS

A. M. Patlach, "Laser Packaging", *IBM TDB*, vol. 13, No. 2, July 1970, pp. 337-338.
P. S. Zory, "Continuous Wave Laser Array", *IBM TDB*, vol. 18, No. 10, Mar. 1976, pp. 3497-3498.

*Primary Examiner*—Andrew J. James
*Assistant Examiner*—James W. Davie
*Attorney, Agent, or Firm*—Charles P. Boberg

[57] ABSTRACT

An array of closely spaced injection lasers is mounted upon a common substrate of grooved semiconductor or insulating material, with the active (hot) layers of the lasers as close as possible to the substrate. Individual grooves of relatively large cross-sectional area are formed in the portions of the substrate upon which the respective lasers are seated, each of these grooves underlying a respective one of the lasers, and each groove is filled with a material that has high thermal and electrical conductivity, thereby providing a massive beam lead which also serves to dissipate heat generated by the respective laser. The walls of the grooves are treated to provide electrical isolation between the beam leads, so that these leads can be used to establish individual switching connections to the active elements of the respective lasers. With this arrangement, individual lasers in the array can be independently switched on and off as needed during a multiple beam scan, and each laser has an individual heat sink for efficiently dissipating the heat that it generates.

6 Claims, 3 Drawing Figures

INJECTION LASER ARRAY

BACKGROUND OF THE INVENTION

This invention relates generally to semiconductor packaging, and in particular it relates to the packaging of injection laser arrays.

Injection lasers, particularly those of the double-heterojunction gallium arsenide (DH GaAs) type, are of very small size and yet are able to generate powerful and highly concentrated light beams. For these reasons it has been proposed to utilize arrays of such lasers closely spaced together in situations where multiple-beam scanning is desired. One proposed application of multiple-beam scanning is thermal transfer printing, wherein a one-dimensional array of closely spaced lasers generates a plurality of beams which will be caused to scan in unison along parallel paths on a thermal transfer ribbon positioned against a paper, each of the beams being appropriately modulated by on-off switching actions for causing selected elements of characters to be printed in a particular row of each character matrix, the result being that an entire line of characters is printed during each scan of the multiple beam group across the paper.

In an application of this kind it is preferable that the laser array be designed to operate in air at room temperature without overheating so that the apparatus will not be encumbered with cooling equipment of the kind needed to maintain very low ambient temperature. Operation of injection lasers in such close proximity at room temperature gives rise to a heat dissipation problem which is made more severe by the fact that in this kind of array, where each laser must be capable of switching on and off individually as needed during each scan of the beam, it is necessary to make isolated electrical switching connections to the individual lasers on their "hot" sides, where the controllable active regions of the lasers are located. This makes it impossible to mount the lasers so that their hot sides are in direct contact with a common heat sink such as a copper block, because the common interconnection provided by such a heat sink would obliterate the individual switching connections that are required. The other side of the laser array, where a common electrical return connection can be made, cannot be used as a heat sink inasmuch as the relatively thick substrate between the hot layers and the common return has a poor thermal conductivity. Thus, the only side of the injection laser array which is permitted to have direct contact with an electrically conductive member common to all of the lasers is the side where the thermal conductivity is poor, whereas the side of the array where the thermal conductivity is good cannot be mounted directly upon a common heat sink because of the requirement that isolated switching connections be made to the respective lasers on that side of the array.

Prior attempts to resolve this dilemma have not met with notable success. Generally it has been the practice in designing this type of array to accept relatively inefficient heat dissipation as the price which must be paid to satisfy the requirement for electrical isolation among the individual laser switching circuits. This practice has tended to reduce the value of laser technology for applications of the kind mentioned above.

SUMMARY OF THE INVENTION

An object of the invention is to provide a more satisfactory solution of the problem stated above. In particular, the invention stems from the discovery that heat can be conducted at a high rate from an injection laser array without detracting from the required isolation between individual lasers by appropriately designing the electrical connections to the heat sink sides of the respective lasers so that the individual connectors themselves are able to serve also as efficient thermal conductors.

In carrying out the invention, an array of injection lasers is mounted upon a common substrate of semiconductor material which has been etched to provide a groove of relatively large cross-sectional size beneath the active region of each laser, that is, on the hot side of each laser. The walls of each groove are suitably treated to provide electrical isolation from adjacent grooves, and each groove is filled with a material having high electrical and thermal conductivity to form a massive beam lead which can serve both as an individual electrical connector to the active element of the laser and also as an efficient heat conductor. Thus, the heat generated by each laser is efficiently transferred away from the laser array without having to employ a common metallic heat sink that would be in simultaneous contact with the active sides of all the lasers in the array. Then, in a location remote from the laser array the heat can be transferred through large area interfaces to a suitable heat exchanger which is maintained near room temperature by heat exchange with the ambient air. This heat exchanger may include a thermoelectric cooler to reduce the temperature of its cooling surfaces slightly below the ambient temperature.

The foregoing and other objects, features and advantages of the invention will be apparent from the following more particular description of a preferred embodiment of the invention, as illustrated in the accompanying drawings.

DETAILED DESCRIPTION OF A PREFERRED EMBODIMENT

Figure 1:
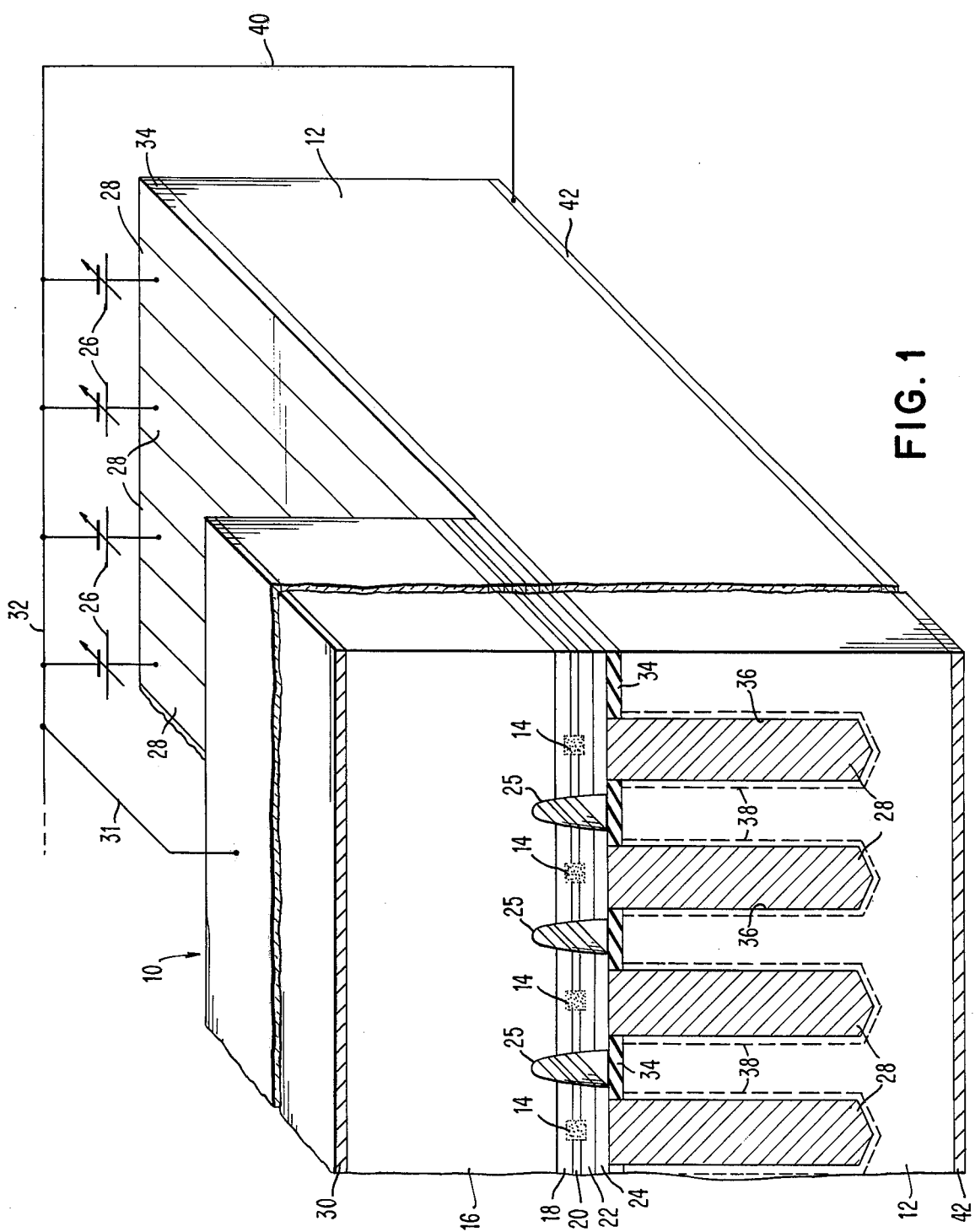
FIG. 1 is a schematic perspective representation, on a magnified scale, of an injection laser array package constructed according to the invention.

FIG. 1 fragmentarily represents a double heterojunction (DH) laser 10 mounted upon and suitably bonded to a substrate 12 of semiconductor or insulating material which has been modified to serve as a heat sink in a manner that will be explained hereinafter. As will be described in greater detail presently, the laser 10 is built initially as a unitary device, but it then is specially treated in a way such that its epitaxial layered portion is effectively subdivided into a one-dimensional array of active laser devices having relatively narrow widths, the respective positions of these devices being indicated in FIG. 1 by the row of solid rectangles 14. Each of the active devices 14 functions as a separate injection laser for generating a coherent light beam when appropriately excited.

FIG. 1 represents the array of lasers 14 as a horizontally aligned row. It is understood, of course, that this is only one example of the various ways in which the lasers may be arranged.

The DH laser 10 from which the individual smaller lasers or active devices 14 are formed is fabricated preferably in the manner disclosed by U.S. Pat. No. 3,936,322, issued on Feb. 3, 1976 to Joseph M. Blum et al and assigned to the assignee of the present application (IBM docket No. YO974-009). Over one surface of a substrate 16 of n-type gallium arsenide (GaAs) there are grown successive epitaxial layers comprising a layer 18 of n-type gallium aluminum arsenide (such as $Ga_{0.7}Al_{0.3}As$, for example), followed by a layer 20 of p-type GaAs, then a layer 22 of p-type $Ga_{0.7}Al_{0.3}As$, and finally a layer 24 of p-type GaAs. FIG. 1 does not represent the true proportions of the various layers. In practice the thicknesses of these layers typically would be as follows:

Substrate 16 — 100 microns
Layers 18, 22 and 24 — 1 micron or less
Layer 20 — 0.2 micron If electric current is caused to flow transversely through the various layers of the laser 10, the recombination of electrons and holes in the p-type GaAs layer 20 will produce light which can exit through the discrete areas denoted by rectangles 14. Normally the entire layer 20 would function as an active region for recombination of holes and electrons. For present purposes, however, it is desirable that such action occur only in narrow strips of the layer 20 which are positioned within the boundaries denoted by the solid rectangles 14 in FIG. 1. The intervening portions of the layer 20 which are located between these bodies 14 are rendered inactive by any of several known methods. One method of deactivating the intervening regions is to employ a process of ion implantation as described in the aforesaid Blum et al U.S. Pat. No. 3,936,322 for rendering such regions nonconductive. Grooves 25 may be cut through the layers 18–24 at places intermediate the hot regions 14 to prevent thermal cross-talk. Both techniques may be used in combination if desired.

Figure 3:
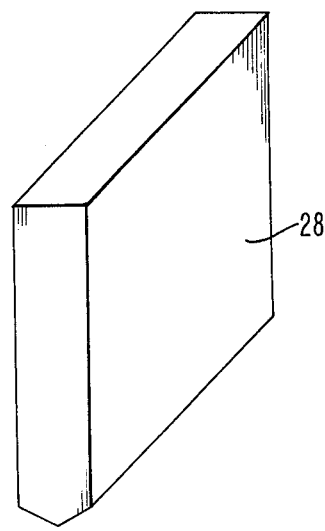
FIG. 3 depicts the type of beam lead which is formed in each groove of the substrate to serve as a combination electrical connector and individual heat sink for one of the lasers in the array.

For turning the individual lasers 14 on and off selectively as their respective beams move across the surface to be scanned, there are provided individually switched control circuits including the voltage sources 26, each of which is connected on one side thereof to a respective one of the active devices 14 by a conductive lead 28 (FIGS. 1 and 3) that extends along the surface of the substrate 12 in contact with the layer 24 of its respective device 14. The outer surface of this layer 24 is doped with zinc or otherwise suitably treated to insure good electrical contact between the devices 14 and their respective leads 28. Isolation between the respective leads 28 within the substrate 12 is provided in a manner that will be explained presently.

The exposed surface of the laser substrate 16 is coated with a thin metal layer 30 that serves as a common electrode through which an electrical connection 31 is established to a common conductor 32 leading to the power sources 26. It will be noted that the return path 30–32, which is common to all of the active devices 14, is on the side of the laser array where the relatively thick gallium arsenide substrate 16 is located, this layer 16 being approximately 30 times as thick as the combined depth of the epitaxial layers 18, 20, 22 and 24 in the example described herein. Because of its thickness and the type of material of which it is made, the substrate 16 conducts very little of the heat generated by the active devices 14 to the exposed surface electrode 30; hence no effective heat sink can be provided on that side of the semiconductor package.

Most of the heat generated in the recombination layer 20 is transmitted through the very thin layers 22 and 24 of the lasers 14 to the leads 28 in the individual laser switching circuits and to the substrate 12. In view of the requirement that each of the individual lasers 14 and its switching circuit must be isolated from the other lasers 14 and their switching circuits, grooves 25 are provided in the epitaxial layered portion of the laser 10 as described above, and the parts of layer 24 intermediate the leads 28 and grooves 25 are seated upon an insulating surface, which in this instance is provided by an oxide layer 34 on the surface of the semiconductor substrate 12. The leads 28 also must be insulated from one another, and this is accomplished in a manner that will be explained presently.

Since heat generated within the layer 20 of each active device 14 tends to escape through the thin layers 22 and 24 rather than through the relatively thick substrate 16, a heat sink should be provided on the side of each laser 14 where the layer 24 is located. In a laser array of the kind presently under consideration, however, it is not feasible to employ a single metallic heat sink common to all of the lasers in the array, because such a heat sink would make it impossible to provide individual switching circuits for the lasers 14. Instead, the heat dissipation problem is resolved in accordance with the invention by fabricating the switching circuit leads 28 so that they will serve also as efficient heat conducting elements, each lead 28 being instrumental in dissipating the heat generated by its own laser 14. Hence, each laser 14 in the array has its own individual heat sink 28 which is separate from the heat sinks 28 of the other lasers 14. The respective heat sinks or leads 28 rapidly transfer heat away from the laser array to locations where such heat can be dissipated through suitable means such as a heat exchanger (not shown) which may include a thermoelectric cooler that operates slightly below the ambient temperature.

Figure 2:
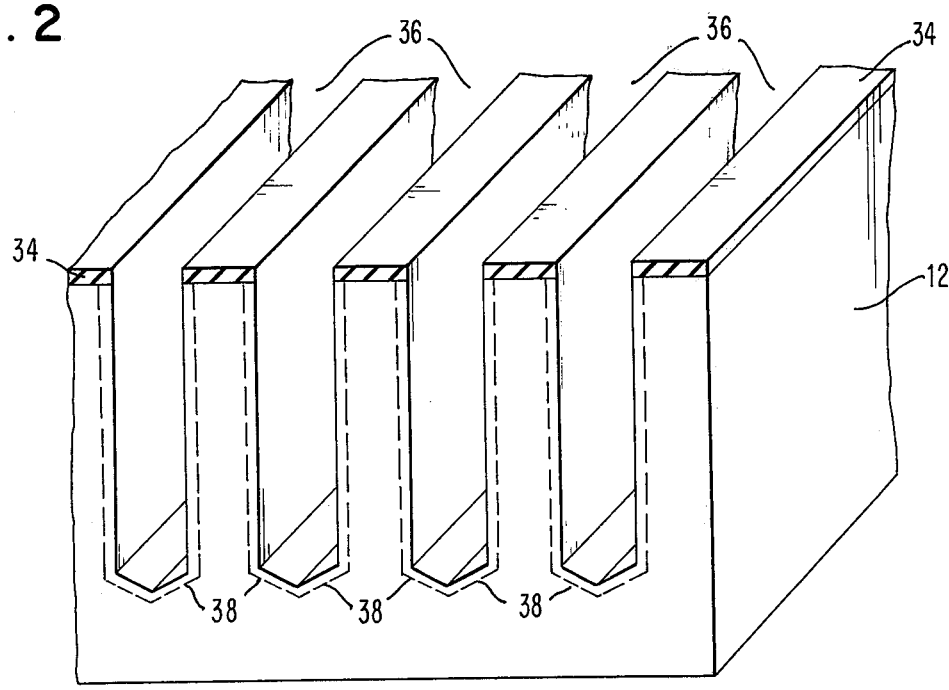
FIG. 2 fragmentarily shows the grooved substrate of this array.

Referring to FIG. 2, the substrate 12 which supports the laser array has a series of parallel grooves 36 therein at locations corresponding to the desired spacing of the leads 28 and lasers 14, FIG. 1. For present purposes it will be assumed that the substrate 12 is made of silicon. It could, however, be germanium or a crystalline insulator. In the present example grooves 36 are formed by etching a silicon substrate 12 so that it has facets along the 111 plane. Typically, each groove 36 is 20 microns wide and 100–200 microns deep, and the center-to-center spacing of the grooves is 50 microns. These are illustrative values only. The semiconductor material in the walls of each groove 36, indicated by the broken lines 38, is treated in a suitable manner to isolate the grooves 36 electrically from each other. This may be accomplished by oxidation or, alternatively, by diffusing an n-type dopant into the wall portions 38 of the grooves 36 in the p-type substrate 12, which then is back-biased by the voltage sources 26 through the lead 40 and electrode 42, FIG. 1. Also, as mentioned above, the surface layer 34 of substrate 12 is oxidized to insulate this substrate from the adjoining surface layer 24 of the laser 10 when the parts are assembled as shown in FIG. 1. Each groove 36 is plated full of a suitable material such as gold which is both a good electrical conductor and a good thermal conductor, thereby providing a massive beam lead 28, FIGS. 1 and 3, that functions as an individual heat sink for each laser 14 to rapidly transfer away from its laser the heat generated therein. Such heat may ultimately be dissipated through the bottom surface of substrate 12 and/or through the exposed portions of leads 28 which extend beyond the laser array 10.

The material of which the substrate 12 is formed will be chosen according to the physical properties desired. It may be a semiconductor (silicon or germanium) or a crystalline insulator. Silicon is selected if it is desired that the substrate 12 have significant heat conducting capability to augment the heat conducting action of the leads 28, since silicon has better thermal conductivity than germanium or an insulating material. If it is preferable that the substrate 12 have a thermal coefficient of expansion which most nearly matches that of the gallium arsenide in the laser 10, in order to insure good contact at all temperatures, then germanium may be selected as the substrate material. A crystalline insulator would have the advantage that it inherently isolates the leads 28 from each other without requiring any special treatment for the groove walls.

During operation of the laser array, the heat generated by each laser 14 is conducted therefrom principally by the beam lead 28 associated with that particular laser and is dissipated in the manner described above. The leads 28 have cross-sectional demensions such that they can function effectively as individual heat sinks for the respective lasers as well as providing the necessary electrical connections through which the lasers can be individually switched on and off as needed. As suggested above, a cross-sectional area on the order of 20 microns in width and 100 or more microns in depth is deemed adequate for this purpose. The total depth of the epitaxial layers 18, 20, 22 and 24, by contrast, is only around 3 microns. Each lead 28 is made wide enough to capture essentially all of the heat generated by its active region 14 and deep enough to transfer such heat quickly away from the region 14.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An injection laser array package comprising:
 a single crystal substrate having in one surface thereof a plurality of generally parallel grooves respectively filled with metallic substance to provide a plurality of electrically conductive heat sinks, the walls of said grooves being defined respectively by intrinsic facet planes in said substrate along which the substrate material is precisely removed and having the property of electrically isolating from each other the heat sinks respectively positioned therein, the depth of each groove being large in comparison with its width, and
 an array of injection lasers mounted upon said substrate with the individual lasers of said array respectively contacting said heat sinks directly, each of said lasers having a controllable active side which is in both a thermally and electrically conductive relationship with the respective heat sink.

2. The laser array package of claim 1 in which said array comprises a common substrate supporting a succession of epitaxially grown layers, at least one of said layers having alternately arranged active and inactive regions therein to define a plurality of active laser devices respectively corresponding to the plurality of grooves in the first-mentioned substrate.

3. The laser array of claim 1 in which said substrate is silicon and wherein the walls of said grooves are facets along the 111 plane and are treated to prevent electrical conduction therethrough.

4. A method of making an injection laser array package comprising the following steps:
 forming a one-dimensional array of injection lasers in closely spaced relation upon a first substrate common to all of said lasers, each of said lasers having an externally controllable active side remote from the side thereof on which said substrate is located,
 forming in one surface of a second substrate of single crystal material a plurality of grooves such that said grooves are spaced from each other according to the spacing of said lasers, said second substrate being so constituted that electrical conduction cannot take place through the walls of said grooves therein, said grooves being formed by precise removal of the crystal material along intrinsic facet planes therein, and each of said grooves having a depth large in comparison with its width,
 filling each of said grooves with a material that has both thermal and electrical conductivity to provide an individual heat sink therein, and
 bonding said laser array to said second substrate in such relation thereto that the active sides of said lasers are directly contacting respective ones of said heat sinks.

5. The method of claim 4 in which said injection laser array is formed by the follwing steps:
 epitaxially growing a succession of variously doped gallium arsenide layers upon a gallium arsenide substrate to form an externally controllable recombination layer within said epitaxial layers, and
 selectively rendering certain parts of said recombination layer nonconductive to define a plurality of alternately arranged inactive and active regions, each of said lasers including a respective one of said active regions.

6. The method of claim 4 wherein said grooves are formed in a substrate of silicon and wherein the walls of said grooves are facets along the 111 plane and are treated to prevent electrical conduction therethrough.

* * * * *